United States Patent Office 3,376,226

Patented Apr. 2, 1968

3,376,226

PIEZOELECTRIC LEAD ZIRCONATE TITANATE CERAMIC WITH CHROMIUM AND THORIUM ADDITIVES

Tsuneo Akashi, Masao Takahashi, Fumio Yamauchi, Norio Tsubouchi, and Tomeji Ohno, Tokyo, Japan, assignors to Nippon Electric Co., Ltd., Tokyo, Japan No Drawing. Continuation-in-part of application Ser. No. 349,323, Mar. 4, 1964. This application Mar. 6, 1967, Ser. No. 620,674

3 Claims. (Cl. 252—62.9)

ABSTRACT OF THE DISCLOSURE

A piezoelectric ceramic composition having a solid solution of lead zirconate - titanate - stannate as a base and additional constituents of small quantities of thorium oxide and chromium oxide. The ceramic composition has a greatly enhanced electromechanical coupling factor and a high mechanical quality factor, as well.

This application is a continuation-in-part of application Ser. No. 349,323, filed Mar. 4, 1964, and now abandoned.

The present invention relates to piezoelectric ceramic compositions and, more particularly, to a novel piezoelectric ceramic material comprised of lead titanate - zirconate - stannate in which certain additional constituents are added to greatly enhance the electromechanical coupling factor and the high mechanical quality factor of the composition.

As is well known, lead titanate - zirconate - stannate piezoelectric materials, which are solid solutions composed of lead - titanate $PbTiO_3$, lead - zirconate $PbZrO_3$ and lead - stannate $PbSnO_3$, exhibit superior piezoelectric characteristics in comparison with other oxide ferroelectric substances, such as barium titanate.

The fundamental parameters for evaluating the piezoelectric properties of a piezoelectric material are the electromechanical coupling factor and the mechanical quality factor. The former is an indication of the efficiency of transforming the electric oscillation into mechanical vibration and conversely, of transforming the mechanical vibration into electric oscillation. Thus, the higher the electromechanical coupling factor, the better the efficiency of conversion.

The mechanical quality factor is in the inverse proportion to energy consumed by the composition during the energy conversion. Larger mechanical quality factors indicate smaller energy consumption, and vice versa.

One of the areas of application of piezoelectric compositions is the manufacture of ceramic filter elements. In manufacturing such elements, it is necessary to furnish an electromechanical coupling factor with an optimum value selected from a wide range, and it is desirable for the mechanical quality factor to be as great as possible. This is described in an article by Macario entitled, "Design Data for Band-Pass Ladder Filters Employing Ceramic Resonators," Electronic Engineering, vol. 33 (1961), No. 3, pages 171–177.

In transducer elements of mechanical filters, it is necessary that both the electromechanical coupling factor and the mechanical quality factor be as large as possible.

The Kulcsar U.S. Patent 3,264,217 suggests the use of thorium additives in improving the electromechanical coupling factor of piezoelectric ceramic elements. The Jaffe et al. U.S. Patent No. 3,216,943, on the other hand, suggests the use of chromium additives to improve the mechanical quality factor of the same piezoelectric ceramic elements. However, the thorium and chromium additives, when used individually, have adverse effects upon the mechanical quality factor and the electromechanical coupling factor, respectively.

It is, therefore, one object of the instant invention to provide a piezoelectric material having a unique composition enhancing both the electromechanical coupling factor and the mechanical quality factor.

Still another object of the instant invention is to provide a novel piezoelectric material of lead titanate - zirconate-stannate compositions which contain two additional constituents that are added in order to enhance both the electromechanical coupling factor and the mechanical quality factor.

Still another object of the instant invention is to provide a novel piezoelectric material formed of a lead titanate - zirconate - stannate composition and having thorium oxide and chromium oxide added thereto to greatly enhance both the electromechanical coupling factor and the mechanical quality factor.

Still a further object of the invention is to provide a novel piezoelectric material having a lead titanate - zirconate - stannate composition wherein a portion of the lead is substituted for by barium, strontium, or calcium.

These and other objects of the invention will become more apparent when reading the accompanying specifications.

The compositions of this invention contain a solid solution of lead - zirconate, lead - titanate, and lead-stannate, which may be represented by $Pb(Zr_xTi_ySn_z)O_3$. Additional constituents of thorium oxide and chromium oxide are provided to enhance the mechanical quality factor and electromechanical coupling factor of the compositions.

The ranges for $x$, $y$ and $z$ are restricted to $x$=0.00–0.90,
$y$=0.10–0.60, and
$z$=0.00–0.65, wherein the total of $x$, $y$ and $z$ is equal to 1.0.

Compositions falling outside this range do not have electromechanical coupling factors of sufficient magnitude to provide efficient piezoelectric ceramic elements for transducers of mechanical filters.

The largest electromechanical coupling factor is obtainable in cases where $x$, $y$ and $z$ are in the range of 0.52–0.53, 0.48–0.47 and 0.00, respectively.

The excellent piezoelectric properties available in the materials described above are not diminished, even if at least one member of the group consisting of barium (Ba), strontium (Sr), and calcium (Ca) is substituted for up to 25 atom percent of the lead content of the basic composition.

The amount of thorium dioxide present may vary from 0.05 wt. percent to 5.0 wt. percent, while the amount of chromium oxide may vary from 0.01 wt. percent to 0.30 wt. percent.

The invention will be explained in detail in the following examples:

Example I

A basic composition (represented by the formula $Pb(Zr_{0.54}Ti_{0.46})O_3$, i.e., $x=0.54$, $y=0.46$, and $z=0.00$) was prepared by mixing a powder consisting of 50 mol percent lead monoxide (PbO), 27 mol percent zirconium dioxide ($ZrO_2$), and 23 mol percent titanium dioxide ($TiO_2$). Varying amounts of thorium dioxide and chromium oxide were added to the mixture. The amount of thorium dioxide never exceeded 5.0%, while the addition of chromium oxide never exceeded 0.30 wt. percent. Some samples contained no thorium oxide. Other samples contained no chromium oxide; while still other samples prepared contained varying mixtures of thorium and chromium oxide. All of the constituents were mixed in a ball mill, and the mixed powder of each respective composition mentioned above was presintered at 900° C. for approximately one hour, crushed, press-molded into discs and sintered at 1300° C. for an hour. The resulting ceramic discs were provided with silver electrodes and were piezoelectrically activated at 100° C. for an hour by means of an applied electric field of 50 kv./cm. After standing for 24 hours, the electromechanical coupling factor for the radial mode vibration (hereinafter referred to as $K_r$) and the mechanical quality factor (hereinafter referred to as $Q_m$) were measured to evaluate the piezoelectric activities. The results obtained are shown in Table I.

TABLE I

| No. | | Composition, Wt. Percent | | $K_r$ (percent) | $Q_m$ |
|---|---|---|---|---|---|
| | | $ThO_2$ | $Cr_2O_3$ | | |
| 1 | $Pb(Zr_{0.54}Ti_{046.})O_3$ | | | 48 | 300 |
| 2 | $Pb(Zr_{0.54}Ti_{0.46})O_3$ | +0.3 | | 51 | 105 |
| 3 | $Pb(Zr_{0.54}Ti_{0.46})O_3$ | +0.5 | | 58 | 90 |
| 4 | $Pb(Zr_{0.54}Ti_{0.46})O_3$ | +0.7 | | 62 | 90 |
| 5 | $Pb(Zr_{0.54}Ti_{0.46})O_3$ | +1.0 | | 61 | 90 |
| 6 | $Pb(Zr_{0.54}Ti_{0.46})O_3$ | +2.0 | | 60 | 90 |
| 7 | $Pb(Zr_{0.54}Ti_{0.46})O_3$ | +3.0 | | 59 | 90 |
| 8 | $Pb(Zr_{0.54}Ti_{0.46})O_3$ | +5.0 | | 50 | 110 |
| 9 | $Pb(Zr_{0.54}Ti_{0.46})O_3$ | +0.05 | +0.30 | 51 | 340 |
| 10 | $Pb(Zr_{0.54}Ti_{0.46})O_3$ | +0.10 | +0.10 | 48 | 560 |
| 11 | $Pb(Zr_{0.54}Ti_{0.46})O_3$ | +0.10 | +0.30 | 50 | 380 |
| 12 | $Pb(Zr_{0.54}Ti_{0.46})O_3$ | +0.20 | +0.20 | 53 | 360 |
| 13 | $Pb(Zr_{0.54}Ti_{0.46})O_3$ | +0.30 | +0.01 | 57 | 110 |
| 14 | $Pb(Zr_{0.54}Ti_{0.46})O_3$ | +0.50 | +0.01 | 59 | 110 |
| 15 | $Pb(Zr_{0.54}Ti_{04.6})O_3$ | +0.50 | +0.02 | 59 | 110 |
| 16 | $Pb(Zr_{0.54}Ti_{0.46})O_3$ | +1.0 | +0.20 | 56 | 320 |
| 17 | $Pb(Zr_{0.54}Ti_{0.46})O_3$ | +3.0 | +0.01 | 63 | 110 |
| 18 | $Pb(Zr_{0.54}Ti_{0.46})O_3$ | +3.0 | +0.30 | 55 | 320 |
| 19 | $Pb(Zr_{0.54}Ti_{0.46})O_3$ | +5.0 | +0.30 | 51 | 320 |
| 20 | $Pb(Zr_{0.54}Ti_{0.46})O_3$ | | +0.01 | 32 | 270 |
| 21 | $Pb(Zr_{0.44}Ti_{0.46})O_3$ | | +0.05 | 27 | 550 |
| 22 | $Pb(Zr_{0.54}Ti_{0.46})O_3$ | | +0.10 | 41 | 770 |
| 23 | $Pb(Zr_{0.54}Ti_{0.46})O_3$ | | +0.20 | 48 | 750 |
| 24 | $Pb(Zr_{0.54}Ti_{0.46})O_3$ | | +0.30 | 40 | 680 |

The results of Nos. 1–8 showed that the incorporation of thorium dioxide by itself into the basic ceramic composition resulted in a marked increase in $K_r$, while suffering a corresponding decrease in $Q_m$.

The results of Nos. 9–19 showed that the addition of both thorium oxide and chromium oxide to the basic composition markedly increased $Q_m$, while maintaining $K_r$ at an equivalent, or increased value as compared with the $Q_m$ values obtained through the addition of thorium dioxide alone. The results of 20–24 showed that the unusual characteristics obtained by mixing both chromium and thorium oxide cannot be obtained by the addition of chromium oxide alone. The addition of chromium oxide, although increasing the mechanical quality factor, correspondingly decreases the electromechanical coupling factor.

In the event that the content of thorium oxide exceeds 5.0 wt. percent, or is less than 0.05 wt. percent, the improvement in characteristics is not obtained even if amounts of chromium oxide are added to the mixture. Correspondingly, in the event that the content of chromium oxide exceeds 0.30 wt. percent, or is less than 0.01 wt. percent, the addition of thorium oxide does little to improve the piezoelectric characteristics of the basic composition.

The improvements made in the piezoelectric properties by the addition of both $ThO_2$ and $Cr_2O_3$ clearly result from the presence of both thorium and chromium ions. Thus, the thorium and chromium ions may be introduced into the basic composition by the use of the oxides or, in the alternative, may be introduced by means of compounds which are decomposed into oxides at elevated temperatures. In the case of thorium, thorium hydroxide, the compounds $Th(OH)_4$ or the like may be used, and in the case of chromium, chromium sulfate, the compound $Cr_2(SO_4)_3$ or the like may be used.

In the event that such compounds are used, they should be utilized in amounts equivalent to the desired mol percent proportions obtained when using the oxides. The results obtained in subsequent examples were derived through processes outlined above with regard to the table of Example 2, unless otherwise recited.

Example 2

Ceramic discs were prepared using the procedure outlined in Example 1 with $x$=0.50–0.56, and $y$=0.50–0.44, while maintaining $z$ at 0.00. Additional amounts of 1.0 wt. percent of thorium oxide were added for some discs, while in others 1.0 wt. percent of thorium oxide mixed with 0.2 wt. percent chromium oxide were added. The results obtained are outlined in Table 2.

TABLE 2

| No. | | Composition, Wt. Percent | | $K_r$ (percent) | $Q_m$ |
|---|---|---|---|---|---|
| | | $ThO_2$ | $Cr_2O_3$ | | |
| 25 | $Pb(Zr_{0.50}Ti_{0.50})O_3$ | | | 29 | 340 |
| 26 | $Pb(Zr_{0.50}Ti_{0.50})O_3$ | +1.0 | | 51 | 110 |
| 27 | $Pb(Zr_{0.50}Ti_{0.50})O_3$ | +1.0 | +0.20 | 47 | 459 |
| 28 | $Pb(Zr_{0.52}Ti_{0.48})O_3$ | | | 45 | 350 |
| 29 | $Pb(Zr_{0.52}Ti_{0.48})O_3$ | +1.0 | | 62 | 95 |
| 30 | $Pb(Zr_{0.52}Ti_{0.48})O_3$ | +1.0 | +0.20 | 58 | 360 |
| 31 | $Pb(Zr_{0.56}Ti_{0.44})O_3$ | | | 43 | 340 |
| 32 | $Pb(Zr_{0.56}Ti_{0.44})O_3$ | +1.0 | | 60 | 98 |
| 33 | $Pb(Zr_{0.56}Ti_{0.44})O_3$ | +1.0 | +0.20 | 56 | 364 |

Table 2 clearly shows that the change of the $x$ and $y$ parameters in the basic composition does not affect the improved piezoelectric activities obtained by utilizing thorium and chromium ions in combination with the basic composition.

Example 3

A basic composition was prepared according to the procedure of Example 1 wherein $x$=0.49, $y$=0.46, and $z$=0.05, and a second composition wherein $x$=0.44, $y$=0.46, and $z$=0.10. Additional amounts of either 1.0 wt. percent of thorium oxide, or a mixture of 1.0 wt. percent of thorium with 0.2 wt. percent chromium oxide were added to the composition. The results obtained are outlined in Table 3.

TABLE 3

| No. | | Composition, Wt. Percent | | $K_r$ (percent) | $Q_m$ |
|---|---|---|---|---|---|
| | | $ThO_2$ | $Cr_2O_3$ | | |
| 34 | $Pb(Zr_{0.40}Ti_{046}.Sn_{0.05})O_3$ | | | 46 | 330 |
| 35 | $Pb(Zr_{0.49}Yi_{046}.Sn_{0.05})O_3$ | +1.0 | | 58 | 100 |
| 36 | $Pb(Zr_{0.49}Ti_{046}.Sn_{0.05})O_3$ | +1.0 | +0.20 | 56 | 370 |
| 37 | $Pb(Zr_{0.44}Ti_{046}.Sn_{0.10})O_3$ | | | 45 | 350 |
| 38 | $Pb(Zr_{0.44}Ti_{046}.Sn_{0.10})O_3$ | +1.0 | | 56 | 100 |
| 39 | $Pb(Zr_{0.44}Ti_{046}.Sn_{0.10})O_3$ | +1.0 | +0.20 | 58 | 350 |

Table 3 indicates the results obtained upon testing these discs. It clearly shows that the substitution of tin for a portion of the basic composition does not impair the piezoelectric properties, which are improved by the presence of thorium and chromium additives.

Example 4

Discs were prepared by the procedure outlined in Example 1, except that barium, strontium, or calcium were substituted for a part of the lead in the basic composition. Table 4 indicates the results obtained thereby.

TABLE 4

| No. | | Composition, Wt. Percent | | $K_r$ (percent) | $Q_m$ |
|---|---|---|---|---|---|
| | | $ThO_2$ | $Cr_2O_3$ | | |
| 40 | $Pb_{0.98}Ba_{0.02}(Zr_{0.54}Ti_{0.46})O_3$ | | | 47 | 270 |
| 41 | $Pb_{0.98}Ba_{0.02}(Zr_{0.54}Ti_{0.46})O_3$ | +1.0 | +0.20 | 58 | 330 |
| 42 | $Pb_{0.98}Ba_{0.02}(Zr_{0.54}Ti_{0.46})O_3$ | | | 48 | 280 |
| 43 | $Pb_{0.98}Ba_{0.02}(Zr_{.054}Ti_{0.46})O_3$ | +1.0 | +0.20 | 57 | 320 |
| 44 | $Pb_{0.94}Sr_{0.06}(Zr_{0.49}Ti_{0.46}Sn_{0.05})O_3$ | | | 46 | 320 |
| 45 | $Pb_{0.94}Sr_{0.06}(Zr_{0.49}Ti_{0.46}Sn_{0.05})O_3$ | +1.0 | +0.20 | 55 | 340 |
| 46 | $Pb_{0.98}Ca_{0.02}(Zr_{0.54}Ti_{0.46})O_3$ | | | 45 | 320 |
| 47 | $Pb_{0.-8}Ca_{0.02}(Zr_{0.54}Ti_{0.46})O_3$ | +1.0 | +0.20 | 56 | 300 |

It is clear that the substitution of one member of the group including barium, strontium, or calcium for a portion of the basic composition does not affect the piezoelectric properties, which are improved by the presence of both thorium and chromium additives.

Examples 1–4 clearly indicate that an improved piezoelectric material is provided by the addition of both thorium and chromium additives to a basic ceramic composition. The basic composition may be of a lead titanate-lead zirconate solid solution or, in the alternative, may include a lead-stannate component. Furthermore, a portion of the lead in the solid solutions may be substituted for by at least one alkaline earth material.

Although there has been described a preferred embodiment of this novel invention, many variations and modifications will now be apparent to those skilled in the art. Therefore, this invention is to be limited not by the specific disclosure herein, but only by the appending claims.

The embodiments of the invention in which an exclusive privilege or property is claimed are defined as follows:

1. A piezoelectric ceramic composition having the formula $PB(Zr_xTi_ySn_z)O_3$, wherein
$x$=0.00–0.90,
$y$=0.10–0.60, and $z$=0.00–0.65, the sum of $x$, $y$ and $z$ being equal to 1.00; said composition incorporating chromium sesquioxide thorium dioxide in amounts of from 0.01 to 0.3 weight percent chromium sesquioxide and from 0.05 to 0.5 weight percent thorium dioxide.

2. The composition of claim 1 wherein
$x$=0.52–0.53,
$y$=0.48–0.47, and
$z$=0.00.

3. The composition of claim 1 wherein up to 25 atom percent of lead (Pb) is substituted for by at least one member of the group consisting of barium, strontium and calcium.

References Cited

UNITED STATES PATENTS

| | | | |
|---|---|---|---|
| 3,216,943 | 11/1965 | Jaffe et al. | 252—62.9 |
| 3,264,217 | 8/1966 | Kulcsar | 252—62.9 |

TOBIAS E. LEVOW, *Primary Examiner.*

ROBERT D. EDMONDS, *Examiner.*